United States Patent
Fisher et al.

(10) Patent No.: US 7,518,251 B2
(45) Date of Patent: Apr. 14, 2009

(54) STACKED ELECTRONICS FOR SENSORS

(75) Inventors: Rayette Ann Fisher, Niskayuna, NY (US); William Edward Burdick, Jr., Niskayuna, NY (US); James Wilson Rose, Guilderland, NY (US)

(73) Assignee: General Electric Company, Niskayuna, NY (US)

( * ) Notice: Subject to any disclaimer, the term of this patent is extended or adjusted under 35 U.S.C. 154(b) by 311 days.

(21) Appl. No.: 11/003,602

(22) Filed: Dec. 3, 2004

(65) Prior Publication Data

US 2006/0118939 A1 Jun. 8, 2006

(51) Int. Cl.
*H01L 23/52* (2006.01)
*H01L 23/48* (2006.01)
*H01L 29/40* (2006.01)

(52) U.S. Cl. .............................. 257/785; 257/E25.013; 257/780; 257/781; 257/786; 438/455; 438/456

(58) Field of Classification Search ......... 257/684–690, 257/E25.006, E25.013, E21.597, E23.004, 257/E23.011, 773, 785, 780, 786, 781; 438/455–457, 438/109
See application file for complete search history.

(56) References Cited

U.S. PATENT DOCUMENTS

| | | | | |
|---|---|---|---|---|
| 5,780,997 A * | 7/1998 | Sutrina et al. | .................. | 322/29 |
| 5,798,050 A * | 8/1998 | Gaynes et al. | ................. | 216/20 |
| 6,114,221 A * | 9/2000 | Tonti et al. | ................... | 438/455 |
| 6,133,637 A * | 10/2000 | Hikita et al. | ................. | 257/777 |
| 6,643,434 B2 * | 11/2003 | Cayrefourcq et al. | ......... | 385/52 |
| 6,667,225 B2 | 12/2003 | Hau-Riege et al. | .......... | 438/462 |
| 6,780,672 B2 * | 8/2004 | Steele et al. | ................ | 438/107 |
| 6,815,254 B2 * | 11/2004 | Mistry et al. | ................ | 438/108 |
| 2002/0024136 A1 * | 2/2002 | Grigg | .......................... | 257/737 |
| 2003/0129829 A1 | 7/2003 | Greenlaw | .................... | 438/637 |

* cited by examiner

*Primary Examiner*—Chris C. Chu
(74) *Attorney, Agent, or Firm*—Patrick K. Patnode (57) ABSTRACT

A stacked electronics module comprises a first layer including a first substrate having a front side and a backside, a first electrical interconnect layer disposed on the first substrate and a first electronic device disposed on the front side of the first substrate. In addition, the stacked electronics module comprises a second layer including a second substrate having a front side and a backside, a second electrical interconnect layer disposed on the second substrate and a second electronic device disposed on the front side of the second substrate.

14 Claims, 6 Drawing Sheets

STACKED ELECTRONICS FOR SENSORS

BACKGROUND

The present invention relates generally to the field of electronic packaging and, more specifically, to the miniaturization of electronic arrays.

Current trends in the consumer market reflect the demand for smaller, lighter products with enhanced features. The need for enhanced functionality demands more memory capacity with decreased available real estate. In order to meet this demand, fabrication of portable products such as cell phones, Personal Digital Assistants (PDAs) and digital cameras may require the implementation of smaller and thinner overall system technologies. Also, to satisfy the needs for high-performance, miniaturized, portable and space-efficient products, the trend in the packaging industry has been to achieve higher system density.

It may be advantageous to implement high density packaging in a number of applications. Such applications may include, for example, medical diagnostic systems, such as, but not limited to ultrasound and mammography. Due to their small size and great demand for functionality, portable medical diagnostic systems may require miniature, high-density electronic packaging.

However, it is becoming increasingly difficult to achieve higher package density while maintaining a small footprint for electronic systems, which may be limited to two-dimensional fabrication techniques. In certain electronic systems, electronic devices may be implemented to drive other devices in the electronic system, such as, but not limited to transducers. Presently, electronic drive devices are generally positioned in the X-Y plane, relative to the other system components, such as transducers, resulting in a huge footprint. Furthermore, the density of input/output (I/O) required for coupling the individual transducers with the associated electronics may be very high. Also, the density of I/O may be too large for traditional interconnect strategies to handle. Presently, the interconnect lengths required to couple the transducer elements to the electronic device may be disadvantageously long.

It would be desirable to fabricate electronics packages having electronic devices and sensors, such as transducers, wherein the packages have increased density but do not have increased footprints. Further, it would be desirable to position the associated electronics devices of the package in close proximity to the individual transducer elements of the transducer array in order to minimize system size, complexity, interconnect lengths and to enhance the performance of the transducer arrays.

BRIEF DESCRIPTION

Briefly, in accordance with one embodiment of the present technique, a stacked electronics module is presented. The stacked electronics module includes a first layer comprising a first substrate having a front side and a backside, a first electrical interconnect layer disposed on the first substrate, a first electronic device disposed on the front side of the first substrate, where the electronic device is configured for processing a plurality of input signals. Additionally, the stacked electronics module includes a second layer comprising a second substrate having a front side and a backside, a second electrical interconnect layer disposed on the second substrate, a second electronic device disposed on the front side of the second substrate, where the electronic device is configured for processing a plurality of input signals.

According to another aspect of the present technique, a method for fabricating a stacked electronics module is presented. The method includes fabricating a first layer including a first substrate having a front side and a backside, disposing a first electrical interconnect layer on the first substrate and disposing a first electronic device on the first substrate. Furthermore, the method includes fabricating a second layer including a second substrate having a front side and a backside, disposing a second electrical interconnect layer on the second substrate and disposing a second electronic device on the second substrate. Additionally, the method includes electrically coupling the first layer to the second layer.

In accordance with another embodiment of the present technique, a stacked electronics module is presented. The stacked electronics module includes a first layer comprising a first substrate having a front side and a backside, a first electrical interconnect layer disposed on the first substrate, a first electronic device disposed on the front side of the first substrate and a plurality of metal pads disposed on the backside of the first substrate. In addition, the stacked electronics module includes a second layer comprising a second substrate having a front side and a backside, a second electrical interconnect layer disposed on the second substrate, a second electronic device disposed on the front side of the second substrate and a plurality of trenches etched on the front side of the second substrate.

According to a further aspect of the present technique, a method for fabricating a stacked electronics module is presented. The method for fabricating a stacked electronics module includes providing a first layer comprising a first substrate having a front side and a backside, disposing a first electrical interconnect layer on the first substrate, disposing a first electronic device on the front side of the first substrate, and disposing a plurality of metal pads on the backside of the first substrate. Additionally, the method for fabricating a stacked electronics module includes providing a second layer comprising a second substrate having a front side and a backside, disposing a second electrical interconnect layer on the second substrate, disposing a second electronic device on the front side of the second substrate, and etching a plurality of trenches on the front side of the second substrate to mate with the metal pads disposed on the backside of the first substrate.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
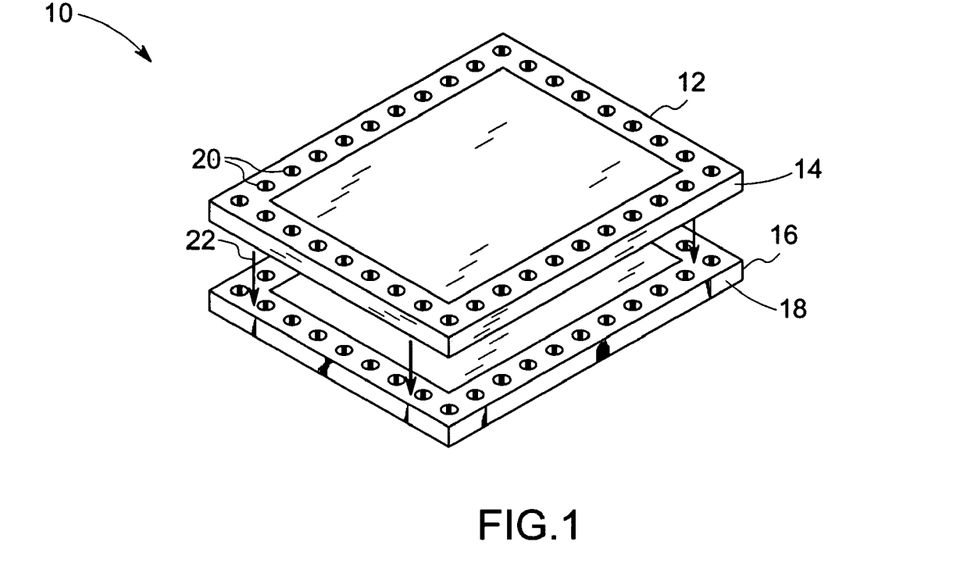
FIG. 1 is a perspective view illustrating an exemplary embodiment of a stacked electronics module, according to aspects of the present technique.

FIG. 1 is a diagrammatical view of an embodiment of a stacked electronics module 10. The stacked electronics module 10 comprises a plurality of layers of electronics configured in a stack. A first layer 12 includes a first substrate 14 having a front side and a backside. Electrical interconnect is disposed on the first substrate 14. In addition, at least one electronic device (not shown) is disposed on the substrate 14 of the first layer 12. Furthermore, a second layer 16 is illustrated as having a second substrate 18 having a front side and a backside. Electrical interconnect is also disposed on the second substrate 18, corresponding to the second layer 16. In accordance with aspects of the present technique, the electrical interconnect disposed on the first substrate 14 and the second substrate 18 may be configured to provide a mechanism to electrically connect the first layer 12 to the second layer 16 in a direction, such as a Z-direction 22. For example, electrical interconnect disposed on the first substrate 14 and the second substrate 18 may employ, for example, through-wafer vias 20, heavily doped semiconductor regions, metal pins, metal plugs or other ways known in the art, in order to electrically couple the interconnect present on the front side of the substrates 14, 18 to the backside of the substrates 14, 18, thereby providing electrically conductive paths from the electronic devices disposed on the front sides of the substrates 14, 18 to the backside of the substrates 14, 18. The adjacent electronic layers 12, 16 may be electrically coupled as will be described hereinafter.

Additionally, according to an exemplary embodiment of the present technique, the second layer 16 is stacked below the first layer 12 in a Z-direction 22. The substrates 14 and 18 may be fabricated employing a semiconductor material. In the illustrated embodiment of FIG. 1, each layer 12, 16, includes at least one electronic device disposed on the corresponding substrate. For example, the electronic devices disposed on the substrates 14 and 18 may include one of a signal processor, a beam former, a pulser, a high-voltage analog circuit, a micro-electromechanical system, a sensor, and a switching circuit.

Advantageously, each individual electronic element may be processed independently employing a method that is optimized for the fabrication of a device having a specific function, such as electrical, mechanical, optical, etc., and assembled on a substrate to form a functional electronic layer. Each functional layer is then tested and known good devices are selected. The known good functional layer is employed in the stack. The functional layers are then coupled in a stack to form a functional package.

According to one embodiment of the present technique, the first layer 12 may include an array of transducers disposed on the front side of the substrate 14. The transducer array may include a plurality of sensor devices, such as, but not limited to a photodiode, a back-illuminated photodiode, an acoustic sensor, a temperature sensor, and an electromagnetic radiation sensor. Additionally, the transducer elements may also include micro-electromechanical systems (MEMs) devices, such as, but not limited to capacitive micro-machined ultrasonic transducers (cMUTs).

Figure 2:
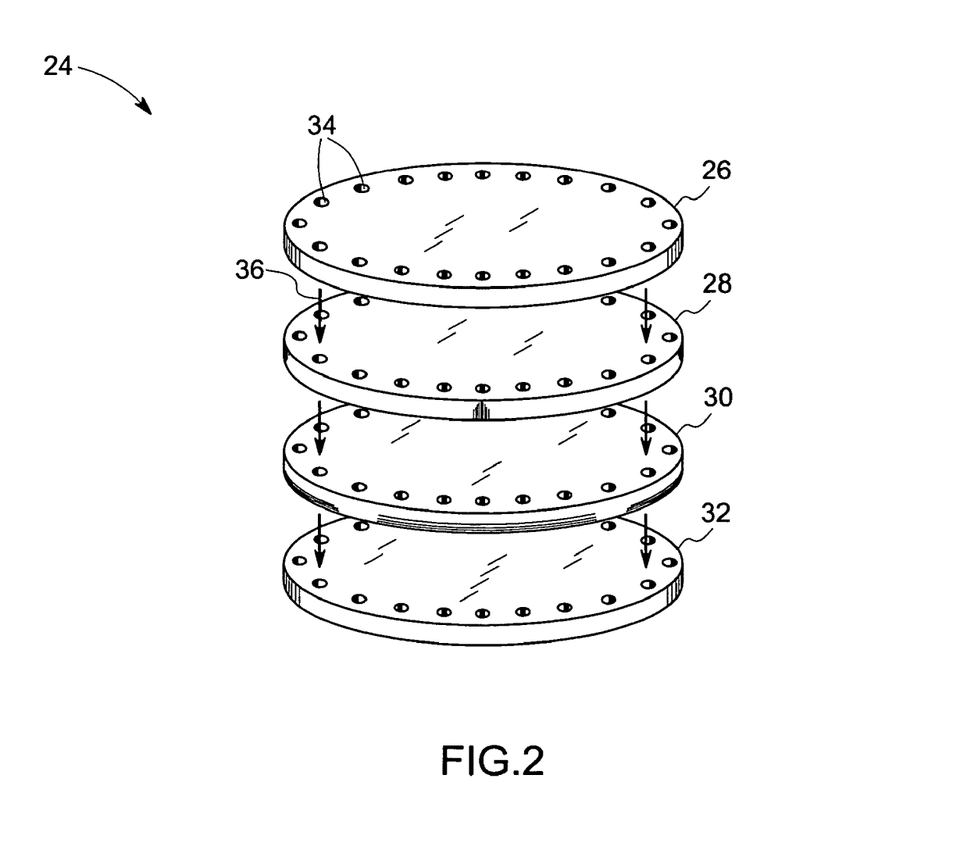
FIG. 2 is a perspective view illustrating an alternate exemplary embodiment of a stacked electronics module, according to other aspects of the present technique.

FIG. 2 illustrates another embodiment of a stacked electronics module 24, according to a further embodiment of the present technique. In FIG. 2 the stacked electronics module 24 is illustrated as including four functional electronic layers 26, 28, 30 and 32. The first layer 26, for instance, may include an array of MEMs sensors and electrical interconnect. The second layer 28 may include high-voltage analog circuits, for instance. The third layer 30 may include an array of passive elements such as resistors, capacitors and inductors, for instance. The fourth layer 32 may include MEMs low-voltage switches, for instance.

Figure 3:
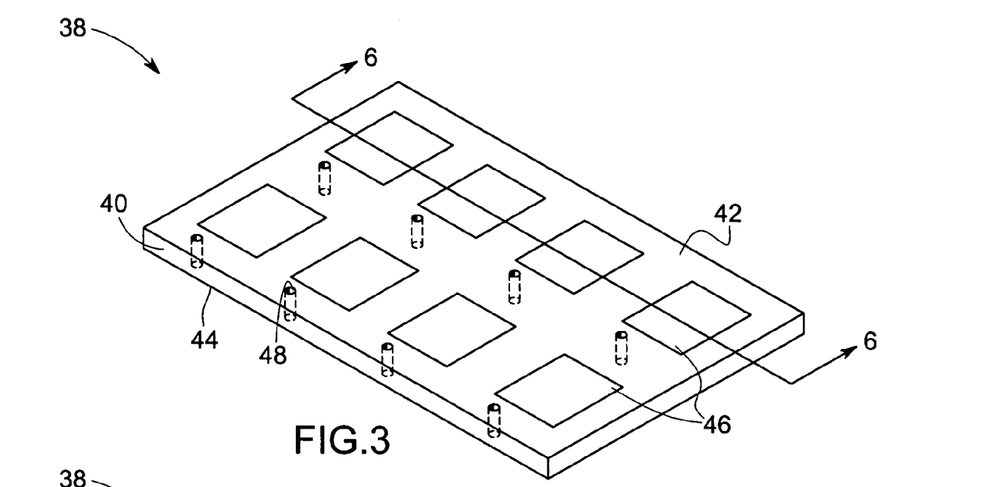
FIG. 3 is a perspective view illustrating a front side of a first electronic layer, according to aspects of the present technique.
Figures 4, 5:
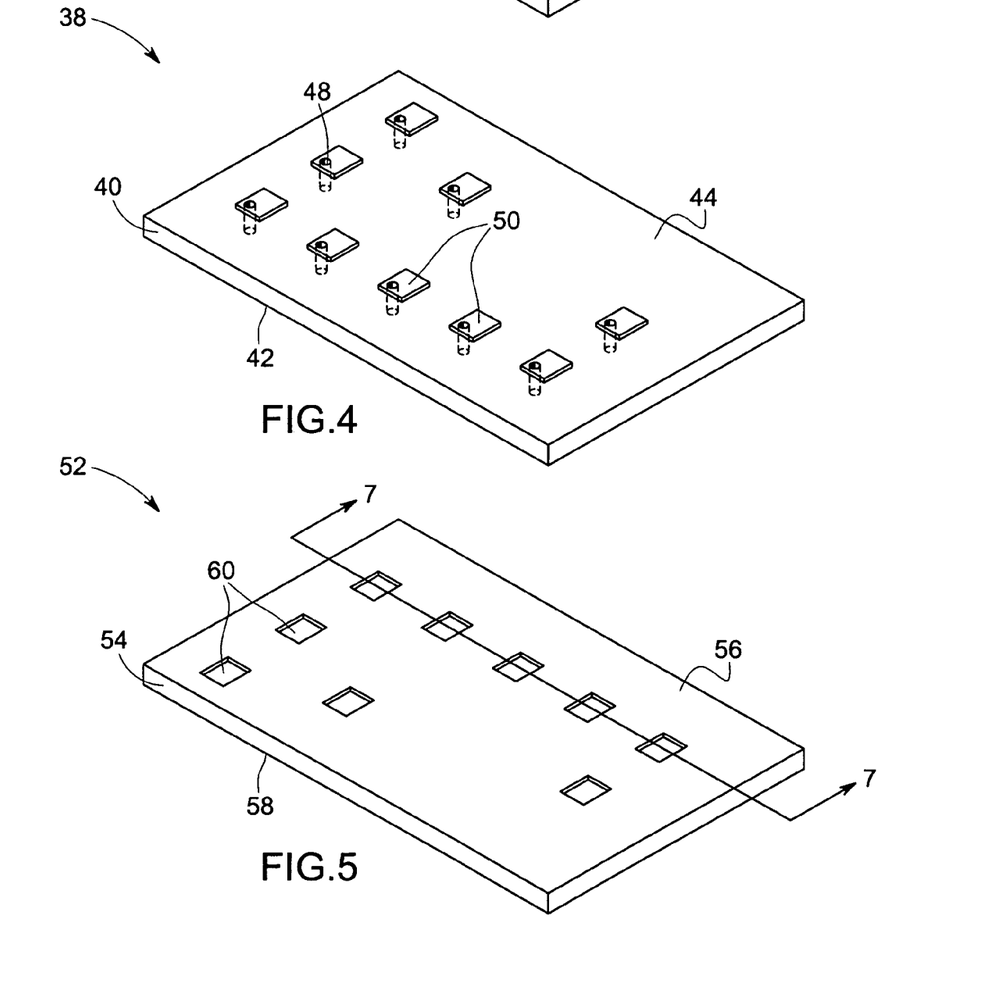
FIG. 4 is a perspective view illustrating a backside of a first electronic layer, according to aspects of the present technique.
FIG. 5 is a perspective view of a front side of a second electronic layer, according to aspects of the present technique.

Vertical conductive regions 34 may be formed through the four layers 26, 28, 30 and 32 in order to electrically couple the interconnect present on the front side of the layers to the backside of the corresponding layers, thereby providing conductive paths from the electronic devices disposed on the front sides of the four layers 26, 28, 30 and 32 to the corresponding backsides of the four layers 26, 28, 30 and 32. In the illustrated embodiment of FIG. 2, the vertical conductive regions 34, such as vias, may be disposed along the perimeter of the four layers 26, 28, 30 and 32. However, as will be appreciated by one skilled in the art, the vertical conductive regions 34 may be disposed in other regions of the layers 26, 28, 30 and 32, as illustrated in FIGS. 3-5.

Furthermore, the four layers 26, 28, 30 and 32 are stacked one on top of the other in the Z-direction 36. Each of the component layers may be fabricated independently, employing optimal methods of fabrication for each layer. The functional layers are then tested and known good devices are selected. Furthermore, the known good functional layers 26, 28, 30 and 32 are then stacked in the Z-direction 36 and coupled to form a functional stacked electronics module 24 as illustrated in FIG. 2. The electrical coupling between the adjacent layers 26, 28, 30 and 32 of the stacked electronics module 24 may be accomplished by methods as will be described hereinafter.

In accordance with an exemplary embodiment of the present technique, one of the four layers 26, 28, 30 or 32 of FIG. 2 may be configured to be an interconnect layer. For example, layers 26, 30 and 32 may be electronic layers. However, the substrate of layer 28 may include acoustic material and may be configured to provide interconnect between electronic layers 26, 30 and 32.

Alternatively, layer 28 may be an interconnect layer configured to provide fan-in of signals from an array of larger pitch to an array of a relatively fine pitch. For example, layer 26 may include an electronics array of larger pitch, while layer 30 may include an array of cMUT transducer elements of a relatively fine pitch. As will be appreciated, the electronics on the layer 26 may not align with the electronics on the layer 30. Accordingly, the front side of layer 28 may have a larger pitch of interconnect to match the larger pitch of the electronics on layer 26, while the backside of the layer 28 may have a finer pitch of interconnect to match the finer pitch of the cMUT transducer elements disposed on layer 30. As will be appreciated, employing an interconnect layer 28 in a stack may advantageously circumvent limitations of processing techniques employed to fabricate the variety of elements, such as electronics, cMUT transducer elements, by providing fan-in of signals.

The interconnect lengths between the transducer elements disposed on a layer in a stacked electronics module and the associated drive and control electronics are minimized by positioning the electronic devices in close proximity to the transducer elements. Minimizing the interconnect lengths improves the performance of stacked electronics modules 10, 24. The method of growing the stacked electronics modules 10, 24 in the Z-direction results in the formation of a three-dimensional electronics module, thus reducing real estate area on a semiconductor wafer.

Building a functional array includes coupling the component layers of the stacked electronic modules 10, 24. For example, the first layer 12 of the stacked electronics module 10 of FIG. 1 is electrically coupled to the second layer 16 to make the stacked electronics module 10 a functional array. The input/output (I/O) connectors associated with the electronics disposed on the front side of the first layer 12 are brought to the backside of the first layer 12 by means of through-wafer vias 20, for example, and are coupled to the corresponding I/O connectors on a consecutive layer, for example, the second layer 16. In general, the coupling between consecutive layers of electronics may be accomplished by means such as, but not limited to conductive bumped or plated metal pads, anisotropic conductive film or fusion bonding. Alternatively, the backsides of the layers 12, 16 on which the electronic devices have been disposed may be thinned to expose the interconnect such as a highly doped region of a semiconductor or a metallized trench, thus enabling a thinner electronic stacked module.

FIGS. 3-5 illustrate an exemplary structure and method for coupling layers in stacked electronics modules of FIG. 1 and FIG. 2, according to an exemplary embodiment of the present technique. A first electronic layer 38 is illustrated in FIG. 3 as including a substrate 40 having a front side 42 and a backside 44. An electronic device may be disposed on the front side 42 of the substrate 40. However, in a presently contemplated embodiment of the present technique, a plurality of transducers 46 is disposed on the front side 42 of the substrate 40. Electrical interconnect that facilitates coupling between the transducer elements 46 is also disposed on the substrate 40. In order to facilitate coupling between the I/O connectors associated with the transducer elements 46 disposed on the front side 42 of the substrate 40 and a corresponding electronic device disposed on a subsequent layer, the I/O connectors are electrically coupled to the backside 44 of the substrate 40 by means of through-hole vias 48.

In a presently contemplated configuration, coupling between consecutive electronic layers in a stacked electronics module is accomplished via the use of metal pads disposed on a surface of an electronic layer. Referring now to FIG. 4, the backside 44 of the first layer 38 is illustrated. The I/O connectors are disposed on the front side 42 of the substrate 40 and electrically coupled to the backside 44 of the substrate 40 by way of through-hole vias 48. A plurality of metal pads 50 is disposed on the backside 44 of the substrate 40. In the illustrated configuration of FIG. 4, one metal pad 50 has been disposed on the backside 44 of the substrate 40 for each through-hole via 48. The metal pad 50 may include a bumped metal pad or a plated metal pad. Such metal pads 50 facilitate the coupling of the first layer 38 to a subsequent layer in a package, such as the stacked electronics module 10 of FIG. 1.

In order to enable the coupling between consecutive layers 12, 16 of electronic devices in the stacked electronics module 10 as illustrated in FIG. 1, the I/O connectors of a first layer 12 are connected to the I/O connectors of a subsequent layer 16. However, matching the I/O connectors of the first layer 12 to the I/O connectors of the subsequent layer 16 may be complicated. In addition, slight rotation of a die or wafer may result in electrical shorting.

FIG. 5 illustrates a solution to this potential problem, according to an exemplary embodiment of the present technique. Referring now to FIG. 5, a second electronic layer 52 is illustrated as including a substrate 54 having a front side 56 and a backside 58. An electronic device may be disposed on the front side 56 of the substrate 54. To facilitate connecting the second layer 52 to the first layer 38 of FIG. 3, coupling features are disposed on a surface facing the first layer 38, namely the front side 56 of the second layer 52. For instance, a plurality of trenches 60 is etched on the front side 56 of the second layer 52. The plurality of trenches 60 is configured to mate with the plurality of metal pads 50 disposed on the backside 44 of the first layer 38 shown in FIG. 4. Additionally, the trenches 60 are positioned on the front side 56 of the second layer 52 such that the trenches 60 are aligned with the positions of the metal pads 50 disposed on the backside 44 of the first layer 38 of FIG. 3. Such an arrangement of interlocking, mating features facilitates the self-alignment of the I/O connectors of the first electronic layer 38 with the I/O connectors of the second electronic layer 52 during the reflow of the solder or during fusion bonding of one device to another.

Figure 6:
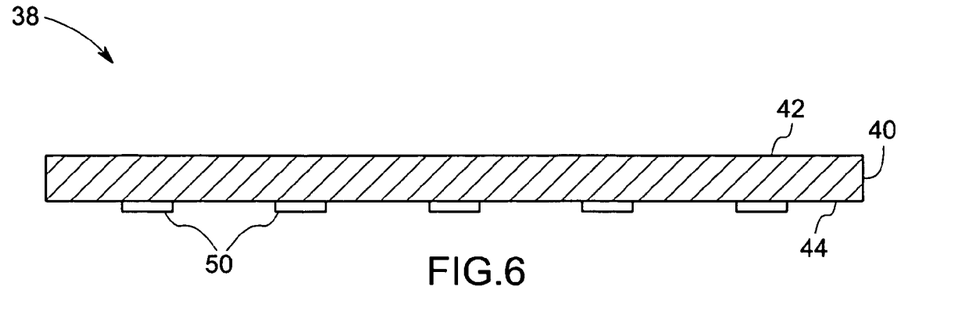
FIG. 6 is a cross-sectional view of the first layer of FIG. 3 along the cross-sectional line 6-6.
Figure 7:
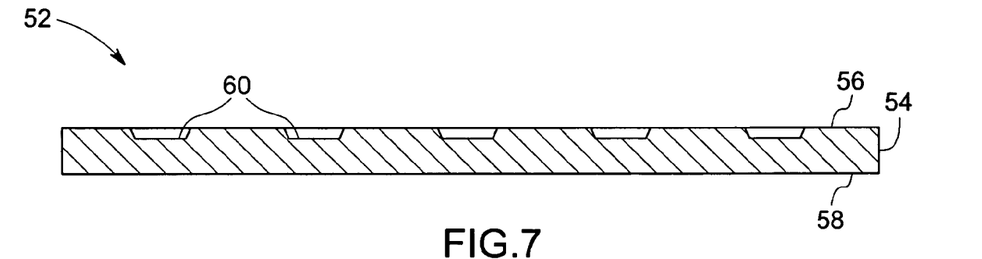
FIG. 7 is a cross-sectional view of the second layer of FIG. 5 along the cross-sectional line 7-7.
Figure 8:
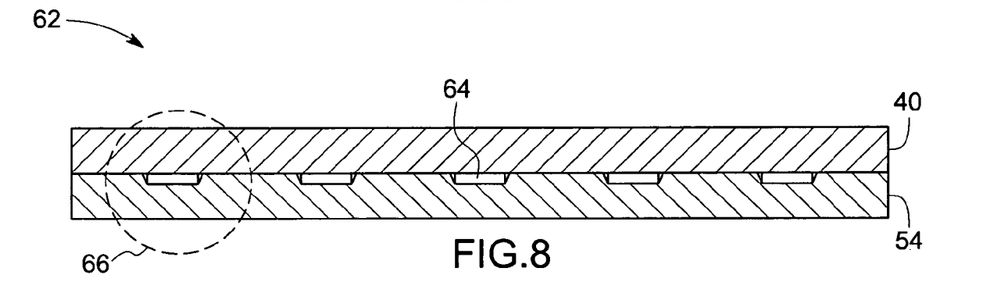
FIG. 8 is a cross-sectional view of an embodiment of the present technique illustrating an interlocking mechanism for coupling adjacent electronic layers in a stacked module.

Turning now to FIG. 6, a cross-sectional view of the first electronics layer 38 of FIG. 3 is illustrated. FIG. 7 depicts a cross-sectional view of the second electronics layer 52 of FIG. 4. FIG. 8 illustrates the coupling of the first layer 38 and the second layer 52 resulting in interlocked electronic layers 62. Furthermore FIG. 8 depicts an interlocking structure 64 that is a result of the mating of the metal pads 50 disposed on the backside 44 of the first electronics layer 38 and the trenches 60 etched on the front side 56 of the second electronics layer 52. In addition, an interlocking structure 66 is represented in FIG. 8.

Figure 9:
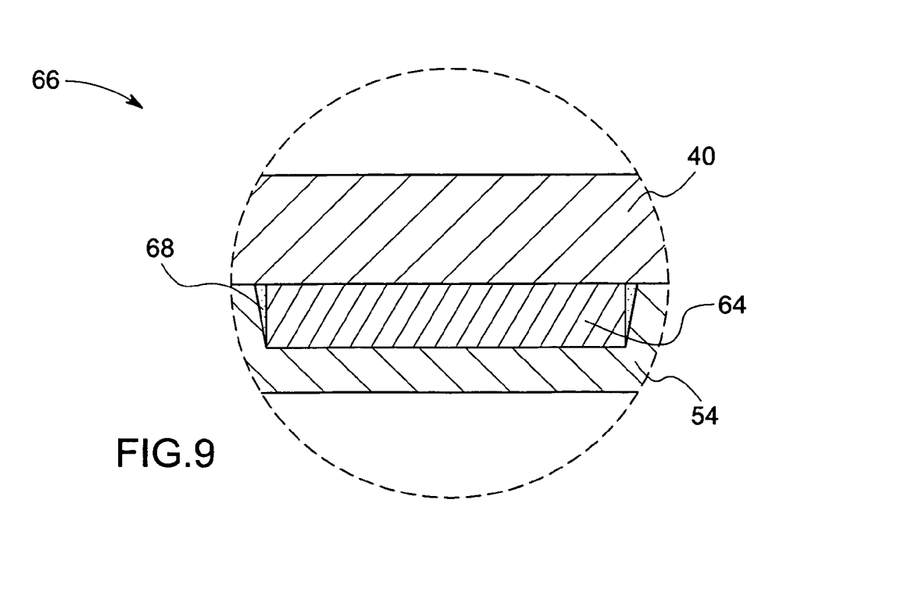
FIG. 9 is an enlarged view of the interlocking mechanism of FIG. 8.

FIG. 9 represents an enlarged view of the interlocking structure 66 of FIG. 8. The mating of the metal pad 50 disposed on the backside 44 of the first layer 38 of FIG. 4 and a trench 60 disposed on a front side 56 of the second layer 52 is illustrated in FIG. 9. During the process of coupling the first electronic layer 38 to the second electronic layer 52, gaps may arise in the interlocking structure 66. Such gaps may be filled with filler material 68 in order to enhance the electrical, mechanical, acoustic or thermal performance of the electronics array. For example, in ultrasound transducers if such gaps arise during the process of coupling two consecutive layers, the gaps may be filled with acoustic enhancing material to minimize acoustic reflections, thereby enhancing the acoustic performance of the ultrasound transducers.

Figure 10:
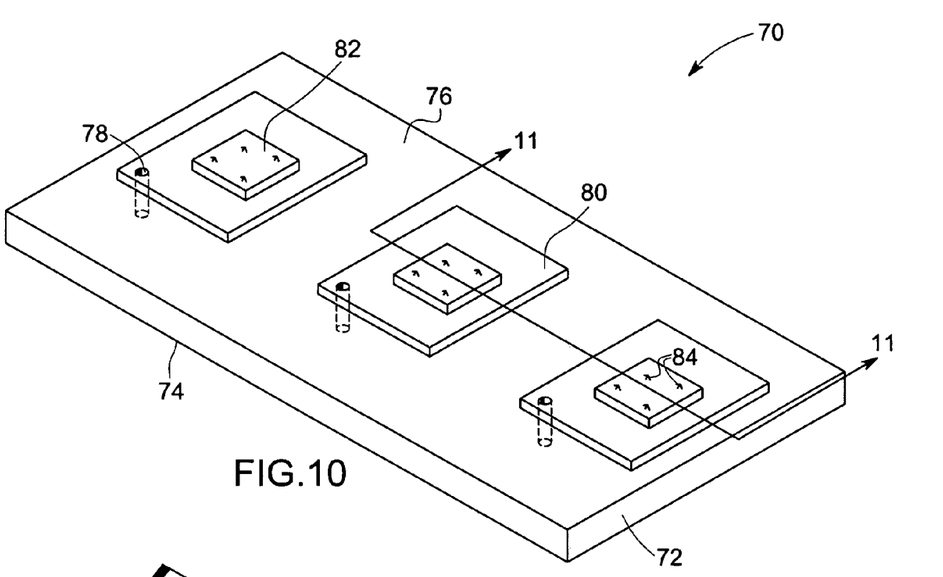
FIG. 10 is a perspective view of a backside of a first electronic layer illustrating an exemplary method for coupling a first electronic layer to a second electronic layer in a stacked module, according to aspects of the present technique.

A structure and method for coupling two adjacent layers in a stacked electronic module, in accordance with another exemplary embodiment of the present technique will now be described. In FIG. 10, a first electronic layer 70 is illustrated as including a substrate 72 having a front side 74 and a backside 76. An electronic device (not shown) is disposed on the front side 74 of the substrate 72. Additionally, an interconnect layer (not shown) is also disposed on the substrate 72. I/O connectors associated with the electronic device disposed on the front side 74 of the substrate 72 are electrically coupled to the backside 76 of the substrate 72 by means of vertical electrically conductive regions 78. A first set of metal pads 80 is disposed on the backside 76 of the first electronic layer 70. One metal pad 80 is disposed for each vertical electrically conductive region 78. In a presently contemplated configuration, a second set of metal pads 82 may also be disposed on the first set of metal pads 80, where material containing conductive particles 84 may be disposed on the second set of metal pads 82. However, the material containing conductive particles 84 may be disposed on the first set of metal pads 80. The material may contain conductive piercing shards, such as metal shards or metal-coated shards that are capable of piercing the adjacent layer or mating feature. The material containing conductive particles 84 facilitate a more reliable electrical connection between the first layer 70 and a subsequent electronic layer by burrowing into the metal disposed on the subsequent electronic layer, as can be appreciated by those skilled in the art. Further, as will be appreciated by those skilled in the art, other techniques for electrically coupling the metal pads 80 and 82 may be implemented.

Figure 11:
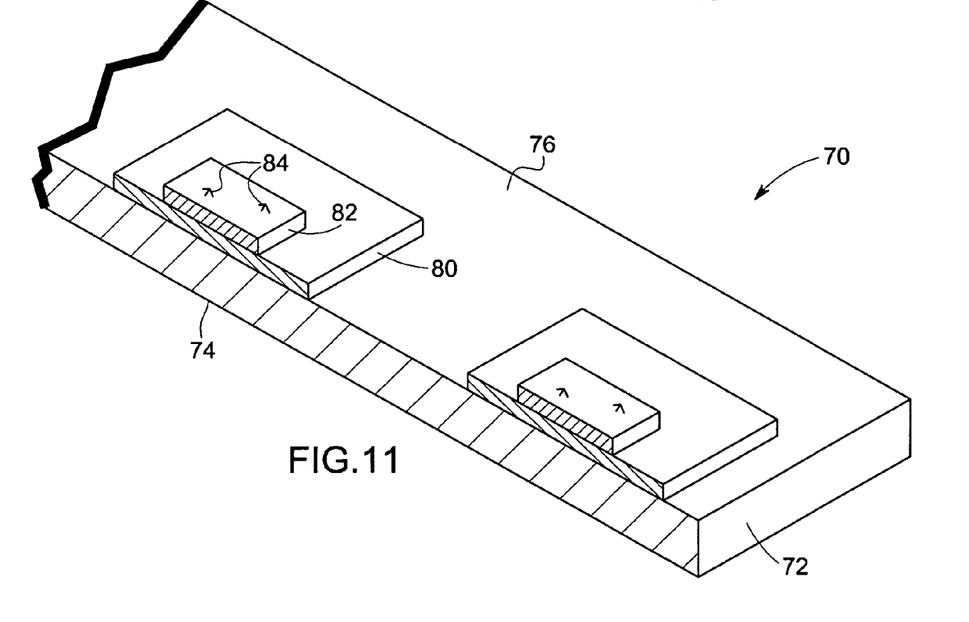
FIG. 11 is a cross-section of the backside of the first electronic layer of FIG. 10 along the cross-sectional line 11-11.
Figure 12:
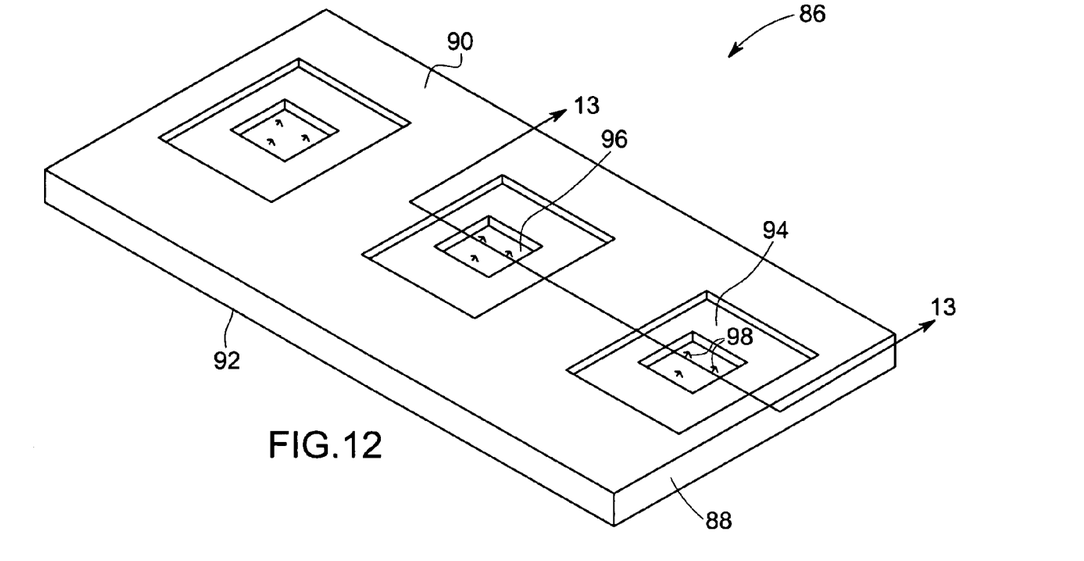
FIG. 12 is a perspective view of a front side of a second electronic layer configured to mate with the backside of the first electronic layer shown in FIG. 10.

FIG. 11 represents a broken view of a cross-section of the backside 76 of the first electronic layer 70 of FIG. 10. Referring to FIG. 12, a second electronic layer 86 is illustrated as including a substrate 88 having a front side 90 and a backside 92. An electronic device (not shown) is disposed on the front side 90 of the substrate 88. Additionally, an interconnect layer (not shown) is also disposed on the substrate 88. To facilitate the electrical coupling of the second layer 86 with the first layer 70 of FIG. 10, coupling features are disposed on a surface facing the first layer 70, namely the front side 90. For instance, a first set of trenches 94 is etched on the front side 90 of the second layer 86. The first set of trenches 94 is configured to mate with the first set of metal pads 80 disposed on the backside 76 of the first layer 70 of FIG. 10. Additionally, the first set of trenches 94 is positioned on the front side 90 of the second layer 86 such that the first set of trenches 94 is aligned with the positions of the first set of metal pads 80 disposed on the backside 76 of the first layer 70. Moreover, a second set of metal trenches 96 are also etched on the front side 90 of the second layer 86 and is configured to mate with the second set of metal pads 82 disposed on the backside 76 of the first layer 70. A material containing conductive particles 98 may also be disposed in the second set of trenches 96 to facilitate increased electrical interconnect reliability. Alternatively, the material containing conductive particles 98 may be disposed in the first set of trenches 94.

In the embodiments illustrated in FIGS. 10 and 12, the first and second sets of metal pads 80, 82 and the first and second sets of trenches 94, 96 may serve a dual purpose of alignment and interconnect. Consequently, in these embodiments, the first and second sets of metal pads 80, 82 and the first and second sets of trenches 94, 96 may be electrically conductive.

Figure 13:
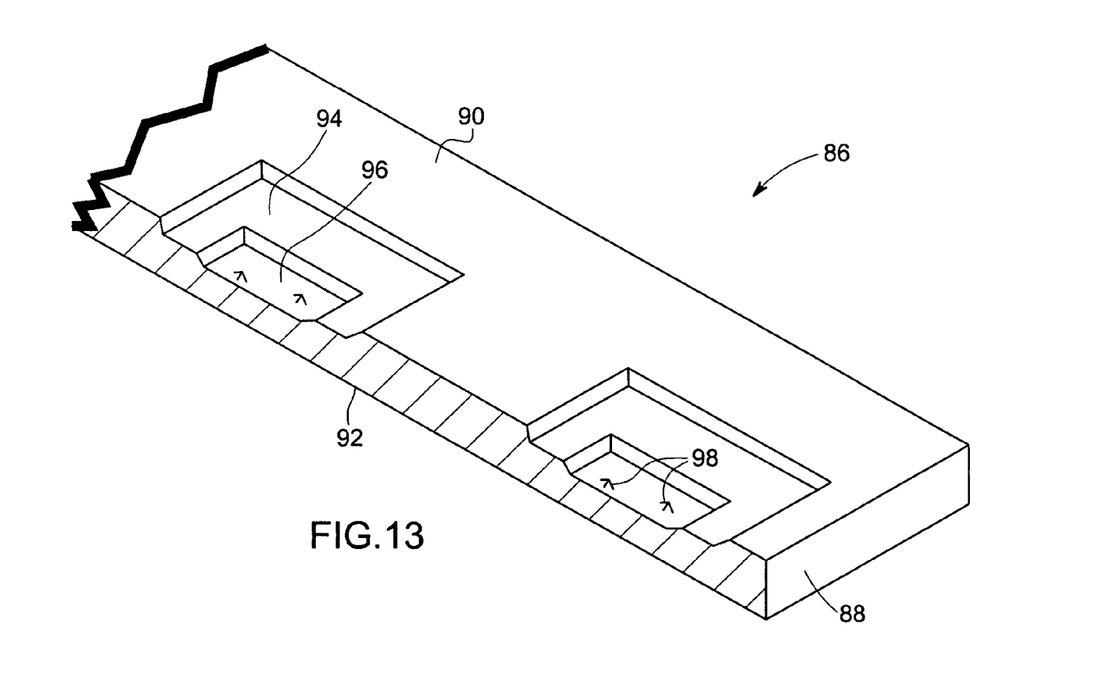
FIG. 13 is a cross-section of the backside of the second electronic layer of FIG. 12 along the cross-sectional line 13-13.

FIG. 13 represents a broken view of a cross-section of the front side 90 of the second electronic layer 86 of FIG. 12. The method described hereinabove represents an exemplary method for aligning adjacent electronic layers where the pads disposed on the first electronic layer 40 and the trenches etched on the adjacent second layer 52 serve as alignment features for aligning a stack of electronic layers.

Figure 14:
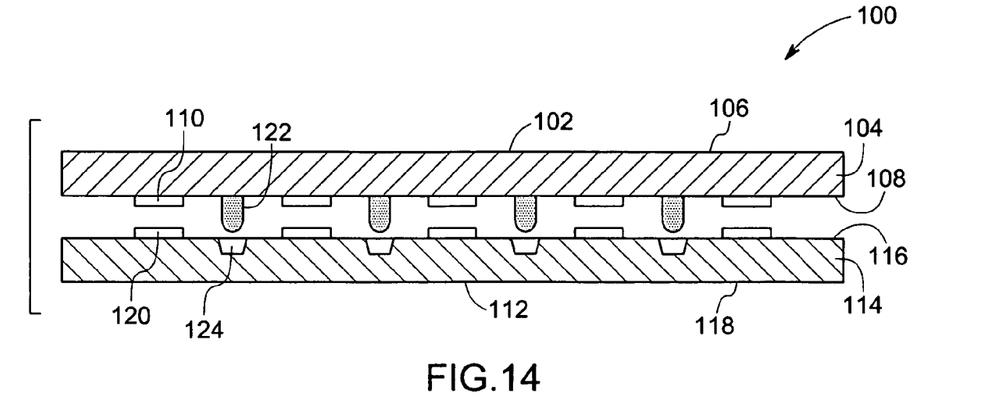
FIG. 14 is a cross-section of an exemplary structure for aligning adjacent electronic layers, according to aspects of the present technique.

Alternatively, according to a further embodiment of the present technique, a mechanism for alignment that employs alignment features such as, but not limited to, protrusions and recesses is illustrated. FIG. 14 illustrates a cross-sectional view of two adjacent electronics layers. Referring to FIG.14, an exemplary structure 100 and method for aligning adjacent electronics layers are illustrated. A first electronics layer 102 is illustrated as including a substrate 104 having a front side 106 and a backside 108. An electronic device may be disposed on the front side 106 of the first substrate 104. A plurality of electrically conductive pads 110 is disposed on the backside 108 of the first electronics layer 104. Similarly, a second electronics layer 112 is illustrated as including a substrate 114 having a front side 116 and a backside 118. In addition a plurality of electrically conductive pads 120 is disposed on the front side 116 of the second substrate 114.

It may be desirable to provide a mechanism to align a stack of electronics layers such that the adjacent electronics layers, stacked in the Z-direction, cannot shift in the X-Y direction. As illustrated in FIG. 14, the plurality of protruding pads 110 may be disposed on the backside 108 of the first electronics layer 102. In a similar fashion, a plurality of protruding pads 120 may be disposed on the front side 116 of the second electronics layer 112. During the process of stacking the two adjacent electronics layers 102 and 112, it may be desirable to align the plurality of protruding pads 110 disposed on the backside 116 of the first electronics layer 102 with the plurality of protruding pads 120 disposed on the front side 116 of the second electronics layer 112. However, during the downstream processing, for example during heat treatment and curing, the alignment of adjacent electronics layers may be disturbed and may result in electrical shorting.

FIG. 14 illustrates a solution to this potential problem, via the introduction of alignment features, such as, but not limited to, protrusions and recesses, according to an exemplary embodiment of the present technique. A plurality of protrusions 122 may be disposed on the backside 108 of the first electronics layer 102.

As will be appreciated by one skilled in the art, a variety of materials may be employed to form the protrusions 122, each having an associated method of fabrication. For instance, in accordance with aspects of the present technique, the protrusions 122 may be formed on the backside 108 from the semiconductor wafer of the first electronics layer 102. Accordingly, the protrusions 122 may be formed by uniformly disposing an etch stop layer on a surface, such as the backside 108 of the wafer of the first electronics layer 102. Further, the etch stop layer may be patterned employing lithographic processes such that only the regions of the protrusions 122 are covered by the etch stop layer. Dry or wet etching of the exposed surfaces form protrusions 122 wherever the surface has been protected by the etch stop layer. Etching techniques, such as reactive ion etching (RIE) or wet etching in potassium hydroxide (KOH) may be tailored to form protrusions 122 having either substantially vertical sidewalls, or sidewall slopes reflecting the crystallographic planes of the semiconductor material. Subsequently, the etch stop layer may be removed.

In accordance with further aspects of the present technique, the protrusions 122 formed on the wafer surface may be formed employing metallic material or polymeric material. A metallic protrusion may be formed employing a variety of techniques. For example, a low-temperature melting point alloy, such as a solder-like metal, may be formed into protrusions by first disposing wettable metal regions on the wafer, applying the solder-like metal, and reflowing the solder-like metal to form protrusions 122 only on the wettable regions. Similarly, polymeric materials may be formed into protrusions 122 by first creating localized regions on the wafer that are wettable by an uncured, liquid polymer, dispensing the polymer onto these regions, and then curing the polymer.

To facilitate aligning the second electronics layer 112 to the first electronics layer 102, alignment features are disposed on a surface facing the first electronics layer 102, namely the front side 116 of the second layer 52. For instance, a plurality of recesses 124 is etched on the front side 116 of the second electronics layer 112. In accordance with aspects of the present technique, reactive ion etching or chemical etching may be employed to form the plurality of recesses 124. As previously mentioned, these techniques may be configured to adjust the sidewall slope or otherwise effect the geometries of the recesses 124. Alternatively, laser etching may also be employed to form the plurality of recesses 124.

The plurality of recesses 124 is configured to mate with the plurality of protrusions 122 disposed on the backside 108 of the first electronics layer 102. Additionally, the recesses 124 are positioned on the front side 116 of the second electronics layer 112 such that the recesses 124 are aligned with the positions of the protrusions 122 disposed on the backside 108 of the first electronics layer 102. Alternatively, a plurality of interlocking structures, that is configured to mate with the protrusions 122 disposed on the backside 108 of the first electronics layer 102, may be disposed on the front side 116 of the second electronics layer 102.

Figure 15:
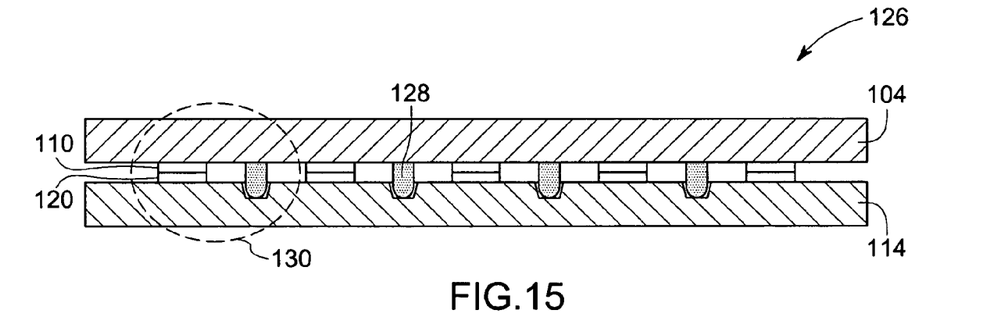
FIG. 15 is a cross-sectional view of an embodiment of the present technique illustrating an interlocking mechanism employing alignment features for coupling adjacent electronic layers in a stacked module.
Figure 16:
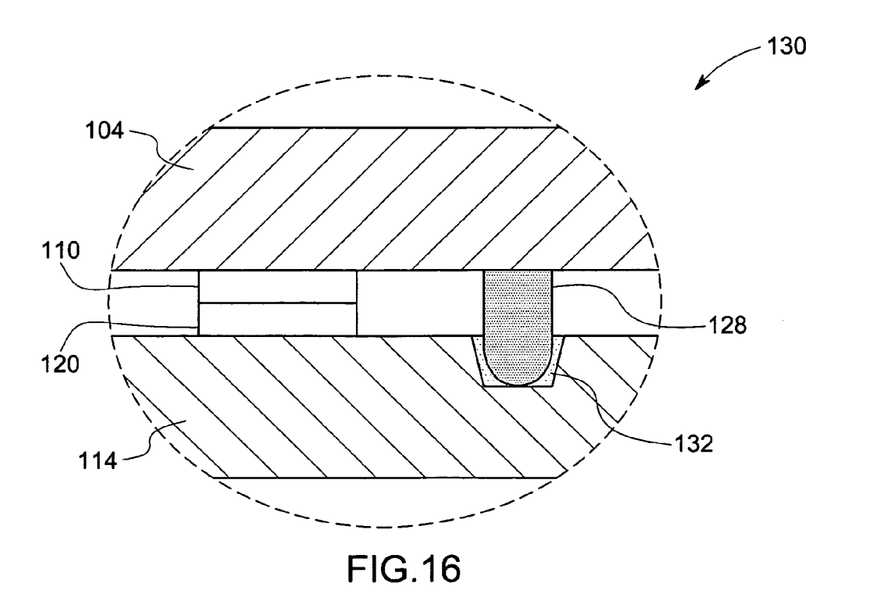
FIG. 16 is an enlarged view of the interlocking mechanism of FIG. 15.

In the embodiments illustrated in FIGS. 14-16, the plurality of protrusions 122 and the plurality of recesses 124 may facilitate alignment of the second electronics layer 112 to the first electronics layer 102. Consequently, in some embodiments, the plurality of protrusions 122 and the plurality of recesses 124 may be electrically non-conductive.

An additional advantage provided by the present technique addresses the initial alignment of substrate 72 to mating substrate 88 (see FIG. 3). As a metal pad 80 is aligned and brought into electrical contact with its corresponding metallized trench 96, the performance of the sensors, such as the transducers 46, and/or other electronics disposed on front side 74 can be dynamically monitored as a function of the alignment position by means of probing I/O contact pads (not shown) also disposed on front side 74. In one example, a pair of metallized trenches 96 may be electrically shorted together on mating substrate 88. The electrical resistance between the I/O pads corresponding to the shorted metallized trenches is dynamically monitored as the alignment of substrate 72 to mating substrate 88 is performed. Satisfactory alignment of the substrates is verified by demonstration of a specified electrical resistance. In another example, the performance of a transducer, such as transducer 46 (see FIG. 3), may be similarly monitored as the alignment is adjusted. In this case, the transducer 46 may be monitored acoustically rather than electrically, and alignment is verified by optimized transducer performance.

FIG. 15 illustrates the coupling of the first electronics layer 102 and the second electronics layer 112 resulting in inter-locked electronics layers 126. As will be appreciated by those skilled in the art, an anisotropic electrically conductive paste may be disposed between the backside 108 of the first electronics layer 102 and the front side 116 of the second electronics layer 112, to provide a physical, as well as electrical connection between the two adjacent electronics layers 102 and 112. Furthermore, FIG. 15 depicts an interlocking structure 128 that is a result of the mating of the protrusions 122 disposed on the backside 108 of the first electronics layer 102 and the recesses 124 etched on the front side 116 of the second electronics layer 112. In addition, an interlocking structure 130 is represented in FIG. 15.

FIG. 16 represents an enlarged view of the interlocking structure 130 of FIG. 15. The mating of the protrusion 122 disposed on the backside 108 of the first electronics layer 102 and a recess 124 disposed on a front side 116 of the second electronics layer 112 is illustrated in FIG. 16. During the process of coupling the first electronics layer 102 to the second electronics layer 112, gaps may arise in the interlocking structure 128. Such gaps may be filled with filler material 132. For example, in ultrasound transducers, if such gaps arise during the process of coupling two consecutive layers, the gaps may be filled with acoustic enhancing material to minimize acoustic reflections.

The stacked electronics modules 10, 24 and the method of fabricating the stacked electronics modules described hereinabove enable the miniaturization of systems which may find application in various fields such as medical diagnostic systems, medical and industrial imaging and non-destructive evaluation and inspection of material which in turn facilitates the portability of such systems. Furthermore, segregating the component electronic layers by functionality and fabricating the functional layers employing the optimal semiconductor process may make the fabrication of the stacked electronic modules more cost effective.

In addition, by positioning the functional electronic layers in close proximity to one another and to the electronic arrays, such as sensors, they may drive, the system function and performance may be greatly enhanced. Such improvements are a consequence of minimized interconnect lengths due to the exclusion of a separate interconnect layer and appropriate alignment of the electronic layers with one another facilitated by the introduction of mating features such as metal pads and matching trenches disposed on consecutive layers. Moreover, stacking the electronic layers in the Z-direction results in considerable saving of precious real estate on the semiconductor wafer. Furthermore, the system and method for coupling subsequent layers of electronics described hereinabove may also be employed for wafer to wafer coupling, device to device coupling, or device to wafer coupling, and each layer of electronics in the stack may be fabricated employing different processes.

Furthermore, an arrangement of interlocking, mating, alignment features facilitates the self-alignment of the pads 110 disposed on the backside 108 of the first electronic layer 102 with the pads disposed on the front side 116 of the second electronic layer 112 during the reflow of the solder or during fusion bonding of one electronics layer to another. This arrangement is advantageous for resolution. Additionally, higher dimensional stability may be achieved during assembly and attach processing. Furthermore, superior layer to layer alignment, that is height uniformity across the interfaces, may be accomplished using the alignment features.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A stacked electronics module comprising:
   a first layer comprising a first substrate having a front side and a backside;
   a first electrical interconnect layer disposed on the first substrate;
   a first electronic device disposed on the front side of the first substrate;
   a first plurality of metal pads disposed on the backside of the first substrate;

a second plurality of metal pads disposed on the first plurality of metal pads;

a second layer comprising a second substrate having a front side and a backside;

a second electrical interconnect layer disposed on the second substrate; and a second electronic device disposed on the front side of the second substrate; and a plurality of trenches formed in the front side of the second substrate, wherein each of the plurality of trenches is configured to matably receive a respective one of the plurality of metal pads to form an interlocking structure to mechanically align the first layer and the second layer in the x-y direction.

2. The stacked electronics module of claim 1, wherein the first substrate comprises a semiconductor material.

3. The stacked electronics module of claim 1, wherein the second substrate comprises a semiconductor material.

4. The stacked electronics module of claim 1, further comprising a plurality of layers of electronic devices configured for processing a plurality of input signals.

5. The stacked electronics module of claim 4, wherein the electronic device comprises one of a pulser, a beam former, a signal processor, a high-voltage analog circuit, a micro-machined electromechanical system, a sensor, and a switching circuit.

6. The stacked electronics module of claim 1, further comprising a plurality of metal pads disposed on the backside of the second layer, wherein each of the plurality of metal pads disposed on the backside of the first layer is configured to selectively couple with a respective one of the plurality of metal pads disposed on the backside of the second layer.

7. The stacked electronics module of claim 6, further comprising material containing conductive particles disposed on the plurality of metal pads disposed on the backside of the first substrate.

8. The stacked electronics module of claim 1, further comprising material containing conductive particles disposed in the plurality of trenches formed in the front side of the second substrate.

9. The stacked electronics module of claim 1, wherein the plurality of metal pads and the plurality of trenches are electrically conductive.

10. The stacked electronics module of claim 1, further comprising a plurality protrusions disposed on the backside of the first substrate.

11. The stacked electronics module of claim 10, wherein the plurality of trenches formed in the front side of the second layer is aligned to mate with the plurality of protrusions disposed on the backside of the first layer.

12. The stacked electronics module of claim 11, wherein the plurality of trenches is aligned with the plurality of protrusions via dynamic aligning.

13. The stacked electronics module of claim 11, wherein the first layer is coupled to the second layer via fusion bonding.

14. The stacked electronics module of claim 11, further comprising filler material disposed within gaps between the plurality of protrusions and the plurality of trenches.

* * * * *